United States Patent
Chen et al.

(10) Patent No.: US 6,754,975 B2
(45) Date of Patent: Jun. 29, 2004

(54) MICROELECTRONIC SUBSTRATE RETAINER APPARATUS PROVIDING REDUCED MICROELECTRONIC SUBSTRATE DAMAGE

(75) Inventors: Hung-Wen Chen, Taichung (TW); David Yen, Chu-Bay (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 11 days.

(21) Appl. No.: 09/761,299

(22) Filed: Jan. 16, 2001

(65) Prior Publication Data

US 2002/0092195 A1 Jul. 18, 2002

(51) Int. Cl.[7] .................................................. F26B 5/08
(52) U.S. Cl. ................................ 34/58; 34/312; 34/317
(58) Field of Search .......................... 34/312, 313, 314, 34/3, 315, 316, 317, 318, 58, 59, 319, 320, 321, 322, 323, 324, 325, 326; 362/384; 15/104.14; 192/103 R; 198/803.1; 99/571

(56) References Cited

U.S. PATENT DOCUMENTS

| | | | | |
|---|---|---|---|---|
| 4,313,266 A | * | 2/1982 | Tam | 34/8 |
| 4,693,017 A | * | 9/1987 | Oeher et al. | 34/58 |
| 4,724,619 A | * | 2/1988 | Poli et al. | 34/58 |
| 5,222,310 A | * | 6/1993 | Thompson et al. | 34/202 |
| 5,339,539 A | * | 8/1994 | Shiraishi et al. | 34/58 |
| 5,651,823 A | | 7/1997 | Parodi et al. | |
| 5,784,797 A | * | 7/1998 | Curtis et al. | 34/58 |
| 5,974,681 A | * | 11/1999 | Gonzalez-Martin et al. | 34/58 |
| 5,988,971 A | | 11/1999 | Fossey et al. | |
| 6,029,369 A | * | 2/2000 | Gonzalez-Martin et al. | 34/317 |
| RE37,347 E | * | 9/2001 | Mackawa et al. | 34/58 |

* cited by examiner

Primary Examiner—Ira S. Lazarus
Assistant Examiner—Kenneth B. Rinehart
(74) Attorney, Agent, or Firm—Tung & Associates

(57) ABSTRACT

An apparatus for attenuating physical damage to a substrate, along with an attendant method, comprises as a first component a base plate having defined therein a location for receiving a substrate cassette. The apparatus also comprises a substrate retainer movably attached to the base plate such that when the substrate cassette having a substrate contained therein is positioned on the base plate at the location for receiving the substrate cassette, and the substrate is subjected to a mechanical force, the substrate retainer moves such as to retain the substrate within the substrate cassette with a retaining force. Both the apparatus and the method are particularly applicable for attenuating damage to a substrate when spin-drying the substrate.

14 Claims, 1 Drawing Sheet

MICROELECTRONIC SUBSTRATE RETAINER APPARATUS PROVIDING REDUCED MICROELECTRONIC SUBSTRATE DAMAGE

BACKGROUND OF THE INVENTION

1. Field of the Invention

The present invention relates generally to methods and apparatus for transporting and processing microelectronic substrates, such as but not limited to semiconductor substrates, employed for fabricating microelectronic fabrications. More particularly, the present invention relates to methods and apparatus for transporting and processing, with reduced physical damage, microelectronic substrates, such as but not limited to semiconductor substrates, employed for fabricating microelectronic fabrications.

2. Description of the Related Art

Integral to the fabrication of microelectronic fabrications of various varieties, and in particular to the fabrication of semiconductor integrated circuit microelectronic fabrications, is the use of substrate cassettes. Within the fabrication of microelectronic fabrications, substrate cassettes are generally employed for purposes of storing, transporting or processing grouped quantities of microelectronic substrates. More particularly with respect to the fabrication of semiconductor integrated circuit microelectronic fabrications, semiconductor substrate cassettes are employed which are generally sized to receive within twenty-five slots fabricated and spaced within a semiconductor substrate cassette up to twenty-five semiconductor substrates spaced within the semiconductor substrate cassette, for purposes of storing, transporting or processing the up to twenty-five semiconductor substrates spaced within the semiconductor substrate cassette.

While substrate cassettes are thus desirable in the art of microelectronic fabrication and often essential in the art of microelectronic fabrication, substrate cassettes are, in particular within the context of their use for transportation and processing of substrates employed for fabricating microelectronic fabrications, nonetheless not entirely without problems in the art of microelectronic fabrication.

In that regard, it is often observed in the art of microelectronic fabrication, for microelectronic substrates that are transported or processed within substrate cassettes employed for fabricating microelectronic fabrications, that the microelectronic substrates are physically damaged incident to their transport or processing within the substrate cassettes. As a particular example, and without limitation, it is often observed in the art of semiconductor integrated circuit microelectronic fabrication that semiconductor substrates that are spin-dry processed within a semiconductor substrate cassette are physically damaged or broken incident to spin-dry processing of the semiconductor substrates within the semiconductor substrate cassette.

It is thus desirable in the art of microelectronic fabrication, and in particular in the art of semiconductor integrated circuit microelectronic fabrication, to provide apparatus and methods wherein microelectronic substrates when transported or processed within substrate cassettes employed for fabricating microelectronic fabrications may be transported or processed with reduced physical damage.

It is towards the foregoing object that the present invention is directed.

Various methods and apparatus have been disclosed in the art of microelectronic fabrication for transporting and processing, with desirable properties, microelectronic substrates employed for fabricating microelectronic fabrications.

For example, Parodi et al., in U.S. Pat. No. 5,651,823, discloses a multi-station microelectronic fabrication photolithographic processing apparatus and a method for operation of the multi-station microelectronic fabrication photolithographic processing apparatus, wherein, among other features, the multi-station microelectronic fabrication photolithographic processing apparatus is designed such as to avoid operator fatigue when operating the multi-station microelectronic fabrication photolithographic processing apparatus. To realize the foregoing object, the multi-station microelectronic fabrication photolithographic processing apparatus employs, in part, a robotic transfer means for transferring microelectronic substrates between various processing stations within the multi-station microelectronic fabrication photolithographic processing apparatus.

In addition, Fossey et al., in U.S. Pat. No. 5,988,971, discloses a semiconductor substrate transfer apparatus that may be employed for transferring, when fabricating a semiconductor integrated circuit microelectronic fabrication, a semiconductor substrate with, among other features, reduced semiconductor substrate physical damage. To realize the foregoing object, the semiconductor substrate transfer apparatus is a robotic semiconductor substrate transfer apparatus that comprises a semiconductor substrate transfer paddle which in turn further comprises: (1) a pair of semiconductor substrate edge grippers for gripping and transferring a semiconductor substrate by its edge, rather than its face; in conjunction with (2) a pair of non-contact sensors that provide proximity information with respect to a semiconductor substrate within a semiconductor substrate cassette.

Desirable in the art of microelectronic fabrication are additional apparatus and methods that may be employed for transporting and processing, with reduced physical damage, microelectronic substrates employed for fabricating microelectronic fabrications.

It is towards the foregoing object that the present invention is directed.

SUMMARY OF THE INVENTION

A first object of the present invention is to provide an apparatus for transporting or processing a microelectronic substrate and a method for transporting or processing the microelectronic substrate.

A second object of the present invention is to provide an apparatus or a method in accord with the first object of the present invention, wherein the apparatus or the method provides that the microelectronic substrate is transported or processed with reduced physical damage.

A third object of the present invention is to provide an apparatus or a method in accord with the first object of the present invention and the second object of the present invention, wherein the apparatus is readily constructed and the method is readily commercially implemented.

In accord with the objects of the present invention, there is provided by the present invention an apparatus for transporting or processing a microelectronic substrate and a method for transporting or processing the microelectronic substrate.

With respect to the apparatus for transporting or processing the microelectronic substrate, the apparatus comprises in a first instance a base plate having defined therein a location for receiving a substrate cassette. The apparatus also comprises a substrate retainer movably attached to the base plate such that when a substrate cassette having a substrate contained therein is positioned on the base plate at the location for receiving the substrate cassette, and the substrate is subjected to a mechanical force, the substrate retainer moves such as to retain the substrate within the substrate cassette with a retaining force.

The apparatus for transporting or processing the microelectronic substrate contemplates a method for transporting or processing the microelectronic substrate which in turn employs the apparatus for transporting or processing the microelectronic substrate.

The present invention provides an apparatus for transporting or processing a microelectronic substrate and a method for transporting or processing the microelectronic substrate, wherein when transporting or processing the microelectronic substrate while employing the apparatus and the method, the microelectronic substrate experiences reduced physical damage. The present invention realizes the foregoing object by employing within the context of an apparatus for transporting or processing a microelectronic substrate, in a first instance, a base plate having defined therein a location for receiving a substrate cassette. Similarly, the apparatus also comprises a substrate retainer movably attached to the base plate such that when a substrate cassette having a substrate contained therein is positioned on the base plate at the location for receiving the substrate cassette, and the substrate is subjected to a mechanical force, the substrate retainer moves such as to retain the substrate within the substrate cassette with a retaining force.

The apparatus of the present invention is readily fabricated and the method of the present invention is readily commercially implemented. As will be illustrated within the context of the Description of the Preferred Embodiment which follows, the apparatus of the present invention may be fabricated employing components as are otherwise generally available in the art of microelectronic fabrication apparatus fabrication. Similarly, and as will also be illustrated within the context of the Description of the Preferred Embodiment which follows, the apparatus of the present invention may be readily employed within at least a microelectronic substrate spin-dry apparatus and a microelectronic substrate spin-dry method. Thus, the apparatus of the present invention is readily fabricated and the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides an apparatus for transporting or processing a microelectronic substrate and a method for transporting or processing the microelectronic substrate, wherein when transporting or processing the microelectronic substrate while employing the apparatus or the method the microelectronic substrate experiences reduced physical damage. The present invention realizes the foregoing object by employing within the context of an apparatus for transporting or processing a microelectronic substrate, in a first instance, a base plate having defined therein a location for receiving a substrate cassette. Similarly, the apparatus also comprises a substrate retainer movably attached to the base plate such that when a substrate cassette having a substrate contained therein is positioned on the base plate at the location for receiving the substrate cassette, and the substrate is subjected to a mechanical force, the substrate retainer moves such as to retain the substrate within the substrate cassette with a retaining force.

The apparatus of the present invention and the method of the present invention may be employed for providing reduced physical damage when transporting or processing substrates employed for fabricating microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Figure 1:
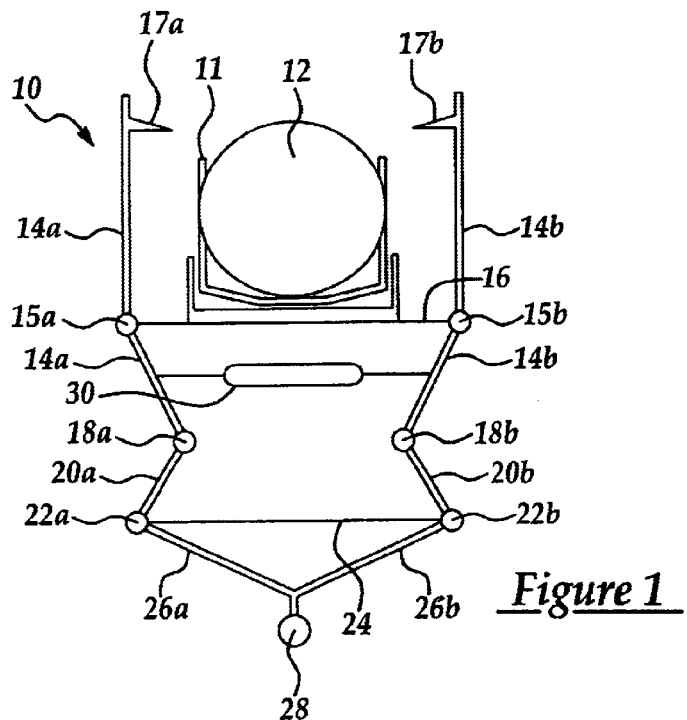
FIG. 1 and FIG. 2 show a pair of schematic diagrams of a preferred embodiment of an apparatus in accord with the present invention within the context of progressive stages of operation of the preferred embodiment of the apparatus of the present invention in accord with a preferred embodiment of a method of the present invention.

Referring now to FIG. 1, there is shown a schematic diagram of an apparatus in accord with a preferred embodiment of the present invention at an early stage in its operation in accord with a method in accord with the preferred embodiment of the present invention.

Shown in FIG. 1 is generally an apparatus 10 comprising all components as illustrated within the schematic diagram of FIG. 1 with the exception of a substrate cassette 11 having positioned therein a minimum of one substrate 12. Within the schematic diagram of FIG. 1, the apparatus 10 comprises, in a first instance, a pair of retaining rods 14a and 14b each one of which is rigid, but nonetheless bent near its center to provide a pair of first fixed pivot points 15a and 15b, a separation distance of which is determined and spanned by an upper connecting rod 16 which has incorporated therein a location for receiving the substrate cassette 11 having positioned therein the minimum of one substrate 12. As is also illustrated within the schematic diagram of FIG. 1, each of the pair of retaining rods 14a and 14b has attached thereto near a first of its ends closer to an upper periphery of the minimum of one substrate 12 as illustrated within the schematic diagram of FIG. 1 a retainer pad 17a or 17b.

As is further illustrated within the schematic diagram of FIG. 1, the apparatus 10 also comprises a pair of tensioning rods 20a and 20b, a first end of each one of which is pivotally connected with a second end of each one of the pair of retaining rods 14a and 14b distal the pair of retainer pads 17a and 17b, to thus form a pair of movable pivot points 18a and 18b. Similarly, a pair of second ends of the pair of tensioning rods 20a and 20b define a pair of second fixed pivot points 22a and 22b whose separation distance is determined and spanned by a lower connecting rod 24.

As is yet further illustrated within the schematic diagram of FIG. 1, the pair of second fixed pivot points 22a and 22b has further connected thereto a pair of equalizing rods 26a and 26b which are joined at their distal ends to form an apex to which is connected a centrifugal ballast 28.

Finally, there is also illustrated within the schematic diagram of FIG. 1 a resilient tensioner 30, such as but not limited to a spring or an elastic member, which is connected to a pair of lower portions of the pair of retaining rods 14a and 14b in a fashion such as to tension the pair of lower portions of the pair of retaining rods towards each other and thus provide adequate spacing such that the substrate cassette 11 having positioned therein the minimum of one substrate 12 may be readily positioned upon the upper connecting rod 16 at the location for receiving the substrate cassette 11 having positioned therein the minimum of one substrate 12, without being impeded by the pair of retainer pads 17a and 17b. It is, however, understood by a person skilled in the art that an alternative resilient tensioner other than the resilient tensioner 30 may alternatively be employed to connect and tension towards each other the pair of movable pivot points 18a and 18b and/or the pair of tensioning rods 20a and 20b while achieving the same result as illustrated within the schematic diagram of FIG. 1.

Within the preferred embodiment of the apparatus 10 of the present invention any of the foregoing components may be formed employing materials as are conventional in the art of microelectronic fabrication apparatus fabrication, and will typically and preferably be fabricated employing metal materials, such as but not limited to stainless steel metal materials, and structural plastic materials, such as but not limited to fluorinated structural plastic materials, as are chemically inert and not otherwise prone to contaminate a substrate, such as the substrate 12, when positioned within a substrate cassette, such as the substrate cassette 11, in turn located upon the location for receiving the substrate cassette as defined within the upper connecting rod 16 within the apparatus 10 whose schematic cross-sectional diagram is illustrated in FIG. 1. Similarly, within the present invention and the preferred embodiment of the present invention, any of the foregoing components may be formed employing dimensions as are required to effectively accommodate the substrate cassette 11 having positioned therein the minimum of one substrate 12, where it is further understood by a person skilled in the art that both the apparatus of the present invention and a substrate cassette which is received into the apparatus of the present invention extend in a third dimension not otherwise illustrated within the schematic diagram of FIG. 1.

In addition, although the preferred embodiment of the present invention illustrates the present invention within the context of the substrate cassette 11 having positioned therein the minimum of one substrate 12 in turn being positioned upon the upper connecting rod 16 at the location for receiving the substrate cassette 11 having positioned therein the minimum of one substrate 12, the present invention is not strictly limited to a connecting rod as a component upon which is positioned a substrate cassette in turn having positioned therein a minimum of one substrate. Rather the present invention may employ any of several geometrically shaped components, such as but not limited to rods, grates, and plates, which are intended to receive a substrate cassette having positioned therein a minimum of one substrate. Within the context of the present invention, any of the foregoing components may be regarded as a "base plate" which is intended within an apparatus in accord with the present invention to receive a substrate cassette having positioned therein a minimum of one substrate.

Similarly, although the preferred embodiment of the apparatus of the present invention as illustrated within the schematic diagram of FIG. 1 illustrates the pair of retaining rods 14a and 14b in turn having assembled thereto the pair of retainer pads 17a and 17b as being connected directly to the upper connecting rod 16, within the present invention alternative geometric configurations are also plausible where mechanical retaining components are indirectly connected to a base plate.

Figure 2:
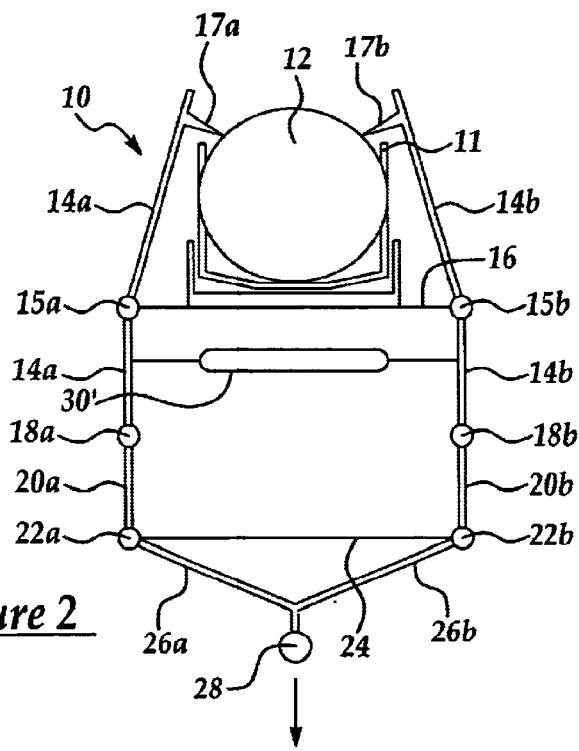

Referring now to FIG. 2, there is shown a schematic diagram illustrating the results of operation of the apparatus whose schematic cross-sectional diagram is illustrated in FIG. 1, further in accord with a preferred embodiment of a method of the present invention.

As is illustrated within the schematic diagram of FIG. 2, upon exertion of a downward force upon the centrifugal ballast 28 in excess of a retaining force of the resilient tensioner 30, the pair of lower portions of the pair of retaining rods 14a and 14b is spread to a more upright position while simultaneously forcing the pair of movable pivot points 18a and 18b outwards and stretching the resilient tensioner 30 such as to provide an elongated resilient tensioner 30', in a fashion such that the pair of retainer pads 17a and 17b positioned near the pair of upper ends of the pair of retaining rods 14a and 14b move to a positions such as to physically retain the minimum of one substrate 12 within the substrate cassette 11 with a retaining force and thus similarly also retain the substrate cassette 11 upon the upper connecting rod 16 at the location for receiving the substrate cassette 11 with the retaining force. Such physical restraint and retention of the minimum of one substrate 12 within the substrate cassette 11 provides for inhibited physical damage of the minimum of one substrate 12 within the substrate cassette 11.

As is understood by a person skilled in the art, the apparatus 10 whose schematic diagrams are illustrated in FIG. 1 and FIG. 2 provides particular value when the apparatus 10 having positioned therein upon the upper connecting rod 16 at the location for receiving the substrate cassette 11, in turn having positioned therein the minimum of one substrate 12, is centrifuged within a plane, typically and preferably a horizontal plane, such as is typical in the art of microelectronic fabrication and more typically particular in the art of semiconductor integrated circuit microelectronic fabrication, when spin-drying a substrate within a substrate cassette incident to and subsequent to wet chemical processing of the substrate within the substrate cassette. Under such circumstances, and in accord with operation of the apparatus whose schematic diagram is illustrated within FIG. 1 and FIG. 2, a retaining force provided to the minimum of one substrate 12 positioned within the substrate cassette 11 through the pair of retainer pads 17a and 17b is typically and preferably proportional to, and additive to, a centrifugal force experienced by the minimum of one substrate 12 itself, since the minimum of one substrate 12 and the centrifugal ballast 28 are centrifuged with respect to the same axis.

Although the application of the apparatus 10 of the present invention, as illustrated within FIG. 1 and FIG. 2, thus most particularly relates to retaining within a substrate cassette a substrate when centrifugally spinning the substrate within the substrate cassette, the present invention may also be employed in a more general sense within the context of an apparatus which is designed to retain a substrate within a substrate cassette under alternative circumstances where the substrate experiences a mechanical force within the substrate cassette. Such mechanical force may result from a mechanical force incident to transporting the substrate cassette, or in the alternative from a mechanical force incident to dropping the substrate cassette. Such a mechanical force may be a linear mechanical force, a centrifugal mechanical force or an alternative geometric mechanical force. The present invention thus contemplates in general for mechanical retention within a substrate cassette of a minimum of one substrate through use of a retaining force incident to an extrinsic mechanical force acting upon the substrate within the substrate cassette.

As is understood by a person skilled in the art, the preferred embodiment of the present invention is illustrative of the present invention rather than limiting of the present invention. Revisions and modifications may be made to components, materials and dimensions employed within the apparatus and method in accord with the preferred embodiment of the present invention, while still fabricating an apparatus in accord with the present invention and a method in accord with the present invention, further in accord with the accompanying claims, wherein in accord with the accompanying claims "a substrate" is intended as meaning "a minimum of one substrate."

What is claimed is:

1. A method for processing a substrate comprising:
   providing a substrate cassette having contained therein a substrate, the substrate cassette being independent of an apparatus;
   positioning the substrate cassette within the apparatus, the apparatus comprising:
      a base plate having defined therein a location for receiving the substrate cassette; and
      a substrate retainer movably attached to the base plate such that when the substrate cassette having the substrate positioned therein is positioned on the base plate at the location for receiving the substrate cassette, and the substrate is subjected to a mechanical force, the substrate retainer moves such as to retain the substrate within the substrate cassette with a retaining force; and
   subjecting the substrate to the mechanical force such that the substrate retainer moves such as to retain the substrate within the substrate cassette with the retaining force.

2. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The method of claim 1 wherein the substrate retainer is directly attached to the base plate.

4. The method of claim 1 wherein the mechanical force is selected from the group consisting of a linear force, a centrifugal force and an alternative geometric force.

5. The method of claim 1 wherein the retaining force is proportional to the mechanical force.

6. The method of claim 1 wherein the apparatus is assembled into a substrate fabrication tool.

7. The method of claim 6 wherein the substrate fabrication tool is a centrifugal spin-dry substrate fabrication tool.

8. An apparatus comprising:
   a base plate having defined therein a location for receiving a substrate cassette separate from the apparatus; and
   a substrate retainer movably attached to the base plate such that when the substrate cassette having a substrate contained therein is positioned on the base plate at the location for receiving the substrate cassette, and the substrate is subjected to a mechanical force, the substrate retainer moves such as to retain the substrate within the substrate cassette with a retaining force.

9. The apparatus of claim 8 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

10. The apparatus of claim 8 wherein the substrate retainer is directly attached to the base plate.

11. The apparatus of claim 8 wherein the mechanical force is selected from the group consisting of a linear force, a centrifugal force and an alternative geometric force.

12. The apparatus of claim 8 wherein the retaining force is proportional to the mechanical force.

13. The apparatus of claim 8 wherein the apparatus is assembled into a substrate fabrication tool.

14. The apparatus of claim 13 wherein the substrate fabrication tool is a centrifugal spin-dry substrate fabrication tool.

* * * * *